United States Patent
Kang et al.

(10) Patent No.: US 9,293,265 B1
(45) Date of Patent: Mar. 22, 2016

(54) METHOD FOR FABRICATING A HIGH EFFICIENCY BIO-PHOTOVOLTAIC CELLS BY USING PLASMONIC SILVER NANOPARTICLES AND NATURAL EXTRACTED GRAMINOIDS

(71) Applicant: KOREA ADVANCED INSTITUTE OF SCIENCE AND TECHNOLOGY, Daejeon (KR)

(72) Inventors: Jeung Ku Kang, Daejeon (KR); Gede Widia Pratama Adhyaksa, Daejeon (KR); Dong Ki Lee, Daejeon (KR); Il Woo Ock, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 14/565,052

(22) Filed: Dec. 9, 2014

(30) Foreign Application Priority Data

Sep. 12, 2014 (KR) .................. 10-2014-0120977

(51) Int. Cl.
*H01G 9/20* (2006.01)
(52) U.S. Cl.
CPC ........... *H01G 9/2004* (2013.01); *H01G 9/2022* (2013.01); *H01G 9/2031* (2013.01)
(58) Field of Classification Search
None
See application file for complete search history.

(56) References Cited

U.S. PATENT DOCUMENTS

| 6,043,428 A * | 3/2000 | Han | H01G 9/2031 136/263 |
| 2007/0157967 A1* | 7/2007 | Mershin | B82Y 10/00 136/263 |
| 2011/0120540 A1* | 5/2011 | Huang | H01G 9/2063 136/255 |

OTHER PUBLICATIONS

Das et al., "Integration of photosynthetic protein molecular complexes in solid-state electronic devices," Nano Letters, Washington, DC, 4:6:1079-1083, 2004.
Wang et al., "From marine plants to photovoltaic devices," Energy and Environmental Sciences, London, UK, 7:1: 343-346, 2014.

* cited by examiner

*Primary Examiner* — Charles Garber
*Assistant Examiner* — Steven Christopher
(74) *Attorney, Agent, or Firm* — Fanelli Haag PLLC

(57) ABSTRACT

Disclosed is a technique for fabricating a bio-photovoltaic cell which includes coupling graminoids extracted from natural grasses to a semiconductor electron acceptor, on which plasmonic silver nanoparticles are aligned, by using an organic ligand material. More particularly, disclosed is a technique for fabricating a new renewable energy generation device useable for fabrication of high efficiency bio-photovoltaic cells by improving a photo-electron generation rate of graminoids through a surface plasmon effect of silver nanoparticles and increasing an effective photo-electron amount transferred to the electron acceptor due to optimized bonding between a photo sensitizer and an electron acceptor.

5 Claims, 3 Drawing Sheets

METHOD FOR FABRICATING A HIGH EFFICIENCY BIO-PHOTOVOLTAIC CELLS BY USING PLASMONIC SILVER NANOPARTICLES AND NATURAL EXTRACTED GRAMINOIDS

This application claims the benefit of the priority date of Korean Patent Application No. 10-2014-0120977, filed on Sep. 12, 2014 in the Korean Intellectual Property Office, the entire disclosure of which is incorporated herein by reference.

FIELD OF THE INVENTION

The present invention relates to a technique for fabricating a bio-photovoltaic cell which includes coupling graminoids extracted from natural grasses to a semiconductor electron acceptor, on which plasmonic silver nanoparticles are aligned, by using an organic ligand material. More particularly, the present invention relates to a technique for fabricating a new renewable energy generation device useable for fabrication of high efficiency bio-photovoltaic cells by improving a photo-electron generation rate of graminoids through a surface plasmon effect of silver nanoparticles and increasing an effective photo-electron amount transferred to the electron acceptor due to optimized bonding between a photo sensitizer and an electron acceptor.

BACKGROUND OF THE INVENTION

Solar cells, that is, photovoltaic cells which are the most advanced technology among clean energy generation systems with the potential to be used with few limitations are recently on a trend of becoming wide-spread throughout industry as well as daily life in Germany, the United States, Japan, or the like, since the 2000s. At present, mono/poly-crystalline silicon photovoltaic cells are most generally used, however, these entail significant costs for production and installation compared to fossil fuel facilities such as gas, petroleum, etc., and such high costs are considered to be a high entry barrier. In order to solve this problem, attempts to develop various photovoltaic cells without using silicon (i.e., an inorganic thin film photovoltaic cell, a fuel-sensitive photovoltaic cell, an organic photovoltaic cell, a quantum dot photovoltaic cell, etc.) have been continued.

Chlorophylls are a key component of all livings existing through photosynthesis to produce nutrients using solar light and water in a natural system, such as plants, green algae, reddish bacteria, or the like, which are pigments serving as a kind of antenna to absorb light energy. These chlorophylls include reaction centers of photosystems II and I, and are a series of cofactors having a unified mechanism wherein light harvesting, energy transfer and electron donating take place continuously. Physical and chemical properties of chlorophylls have been determined indicating that they have various structures by the use of tetrapyrrole templates.

Chlorophylls have excellent absorbency in a visible light region to thus efficiently utilize solar energy incident upon the earth's surface. Also, since chlorophylls are easily extracted in great quantities from plants or green algae, these may become a solution to noticeably reduce a unit cost of a photovoltaic cell if used as a photo sensitizer of the photovoltaic cell. However, a method of efficiently aligning and combining a photovoltaic cell device formed of existing inorganic materials and chlorophylls as a natural biomaterial has not been yet proposed, and hence currently results in a very low light energy transfer efficiency. Accordingly, there have been difficulties in the development of a photovoltaic cell using chlorophylls.

Graminoids are often found in grasses abundantly available in tropical and subtropical areas, and contain both of chlorophyll molecules and graminone lignan so as to exhibit excellent absorbency and photo-electron generation performance, compared to existing chlorophylls. Since photo sensitizer molecules in such a natural system generate photocurrent at an average of about 10 pA per molecule, improvement of photo-electron generation characteristics is required for commonly using these molecules. The surface plasmon effect refers to a characteristic in that, if a rare-metal such as silver or gold exists in a size of several nanometers, this metal may be similar to a semiconductor photo-catalyst material, absorbing light and scattering light in a constant wavelength range again. Therefore, when the above metal is suitably mixed with the bio-photo sensitizer and used, the photo-electron generation efficiency may be increased by about 10 times or more while not destroying any bio-material. Further, existing bio-photovoltaic cells involve poor interfacial contact between the photo sensitizer and a semiconductor-based electron acceptor, hence causing most of electrons generated in the photo sensitizer at an interface therebetween to become extinct due to re-coupling of electrons-holes. Accordingly, this drawback must also be improved upon.

Attempts to use a naturally extracted photo sensitizer as a source of photo-electron generation for a photovoltaic cell have been continuously investigated since research into application of a photosynthetic reactor center extracted from *Rhodobacter sphaeroides* as one of photosynthetic bacteria as well as chlorophylls extracted from spinach to a semiconductor device was disclosed by R. Das et al. (2004). However, since the wavelength range of light absorbed by natural extracts is very narrow and, due to significant differences in environment from when these exist in a natural state inside a living object, a route of flowing electrons and holes generated by receiving light is discontinued, re-coupling of electrons and holes often occurs whereas coupling between the natural extract and the semiconductor-based electron acceptor does not take place actively. Therefore, an amount of finally collected photo-electrons is very small and a bio-photovoltaic cell exhibits considerably reduced light-energy conversion efficiency. The highest light-energy conversion efficiency reported until now is 1.51% only in a case of using a photo sensitizer extracted from sea tangle.

Accordingly, the present invention proposes a method for fabricating a high efficiency bio-photovoltaic cell by using silver nanoparticles expressing surface plasmon effects, a sheet type semiconductor electron acceptor facilitating active bonding between different materials and an organic ligand material, so as to overcome the problems described above.

BRIEF SUMMARY OF THE INVENTION

In consideration of the above-described circumstances, it is an object of the present invention to provide a method for fabricating a high efficiency bio-photovoltaic cell, which includes coupling graminoids extracted from natural grasses as well as silver nanoparticles expressing a surface plasmon effect to a sheet type semiconductor electron acceptor through an organic ligand linker, so as to increase an amount of photo-electrons generated from the graminoids while facilitating the flowing of electrons at an interface of the electron acceptor.

Technical tasks to be achieved by the present invention are not particularly limited to the technical tasks described above, and such tasks not mentioned herein will be obviously understood from the description of the present invention by persons skilled in the technical field to which the present invention pertains.

In order to accomplish the above object, according to an aspect of the present invention, there is provided a method for fabricating a high efficiency bio-photovoltaic cell, which includes: a first process of extracting graminoids from natural grasses such as *imperata cylindrica*; a second process of preparing silver nanoparticles and a sheet type titanium dioxide electron acceptor; a third process of laminating the sheet type titanium dioxide electron acceptor, the silver nanoparticles and the graminoids on a transparent electrode to prepare a photo-electrode; and a fourth process of preparing a platinum coated counter-electrode and injecting an electrolyte between the photo-electrode and the counter-electrode to complete a photovoltaic cell, wherein the inserted silver nanoparticles are coupled to a bio-photo sensitizer through an organic ligand material while exhibiting a surface plasmon effect.

According to the method for fabricating a high efficiency bio-photovoltaic cell using plasmonic silver nanoparticles and naturally extracted graminoids of the present invention, the first process may include extracting graminoids from natural grasses.

According to the method for fabricating a high efficiency bio-photovoltaic cell using plasmonic silver nanoparticles and naturally extracted graminoids of the present invention, the second process may include preparing silver nanoparticles having a size of 13.4 nm by reduction of borohydride ($BH_4^-$), and preparing a sheet type titanium dioxide electron acceptor having a thickness of 7 nm and a size of 50 to 100 nm.

According to the method for fabricating a high efficiency bio-photovoltaic cell using plasmonic silver nanoparticles and naturally extracted graminoids of the present invention, the third process may include laminating the sheet type titanium dioxide electron acceptor prepared in the second process on a transparent electrode by means of doctor blade technique, laminating the silver nanoparticles prepared in the second process thereon by means of electrophoresis and, after dipping the laminate in a water-soluble solution containing the organic ligand linker, immersing the laminate into an ethanol solution containing graminoids extracted in the first process then laminating the same, so as to prepare a photo-electrode.

According to the method for fabricating a high efficiency bio-photovoltaic cell using plasmonic silver nanoparticles and naturally extracted graminoids of the present invention, the fourth process may include piling up the platinum coated counter-electrode on the photo-electrode, inserting a thin Surlyn film therebetween and bonding together, and then injecting an acetonitrile ($CH_3CN$)-based electrolyte that contains an iodine/trivalent iodine ($I/I_3^-$) redox compound, lithium, pyridine and graminoids.

The high efficiency bio-photovoltaic cell fabricated using plasmonic silver nanoparticles and naturally extracted graminoids according to the present invention may have advantages in that: an amount of photo-electrons generated from graminoids by the plasmonic silver nanoparticles is increased; the photon-electrons generated from graminoids by smooth interfacial contact due to an organic ligand material are transferred to the silver nanoparticles without extinction caused by re-coupling of electrons-holes; and a great amount of photon-electrons can be transferred to a titanium dioxide electron acceptor because of excellent fluorescence decay rate and electron transport properties. Therefore, it is possible to provide an advanced method for fabricating a photovoltaic cell possibly to overcome the low photocurrent conversion efficiency of existing bio-photovoltaic cells.

DESCRIPTION OF THE DRAWINGS

FIG. 1 (*b*) is a photograph measured by TEM showing silver nanoparticles prepared in a size of 13.8 nm; FIG. 1 (*c*) is a photograph measured by TEM showing a sheet type titanium dioxide prepared by means of hydrothermal synthesis; FIG. 1 (*d*) is photographs showing EDS element analysis results of FIG. 1 (*a*); FIG. 1 (*e*) is a TEM photograph measured by enlarging the silver particle of FIG. 1 (*b*); FIG. 1 (*f*) is a TEM photograph measured by enlarging the titanium dioxide of FIG. 1 (*c*).

FIG. 2 (*b*) is a diagram illustrating light absorption effects of a silver nanoparticle having a size of 13.8 nm, and absorption and scattering effects calculated by optical computer simulation.

FIG. 3 (*b*) is photographs obtained by a TEM showing measured materials used in FIG. 3(*a*) (left side: $TiO_2$-NP, right side: $TiO_2$-NS); FIG. 3 (*c*) is a diagram showing EQE characteristics of photovoltaic cells fabricated using $TiO_2$-NS (sheet) and $TiO_2$-NP (particle), respectively, as an electron acceptor; and FIG. 3 (*d*) is a diagram showing current-voltage curves of the photovoltaic cells in FIG. 3(*c*).

FIG. 4 (*b*) is a diagram showing current-voltage characteristics of a photovoltaic cell fabricated using the photo-electrode of FIG. 4(*a*).

FIG. 5 (*b*) is a diagram showing current-voltage curves of a photovoltaic cell according to a change in density of a solution containing silver nanoparticles dispersed therein, which is used for laminating silver nanoparticles by electrophoresis.

FIG. 6 (*b*) is a diagram showing current-voltage characteristics of PG and G photovoltaic cells (solid line: results measured under AM 1.5 standard conditions; dotted line: results measured under light-shielded conditions); and FIG. 6 (*c*) is a diagram showing an operation of a bio-photovoltaic cell having the sheet type titanium dioxide electron acceptor applied thereto.

DETAILED DESCRIPTION OF THE INVENTION

Solar cell characteristic values of the photovoltaic cells fabricated according to the present invention are listed in Table 1.

An embodiment of the present invention provides a method for fabricating a high efficiency bio-photovoltaic cell, which includes: a first process of extracting graminoids from natural grasses such as *imperata cylindrica*; a second process of preparing silver nanoparticles and a sheet type titanium dioxide electron acceptor; a third process of laminating the sheet type titanium dioxide electron acceptor, the silver nanoparticles and the graminoids on a transparent electrode to prepare a photo-electrode; and a fourth process of preparing a platinum coated counter-electrode and injecting an electrolyte between the photo-electrode and the counter-electrode to complete a photovoltaic cell, wherein the inserted silver nanoparticles are coupled to a bio-photo sensitizer through an organic ligand material while exhibiting surface plasmon effect.

Natural grasses (for example, *imperata cylindrica*) having similar colors, lengths and textures were washed with water and dried at room temperature. Then, the dried grasses were cut into pieces and grinded using a mortar grinder, resulting in small granules with dark green color. Those granules were dissolved in ethanol (mass ratio (w/w), 1:3) and stored in a dark room for 2 weeks. Then, the stored granules were treated by a centrifuge to filter impurities and subjected to extraction of graminoids using a filtering device. The extracted graminoids were stored in a liquid state with pH 6.9 and a density of 0.8 mg/mL.

Figure 1:
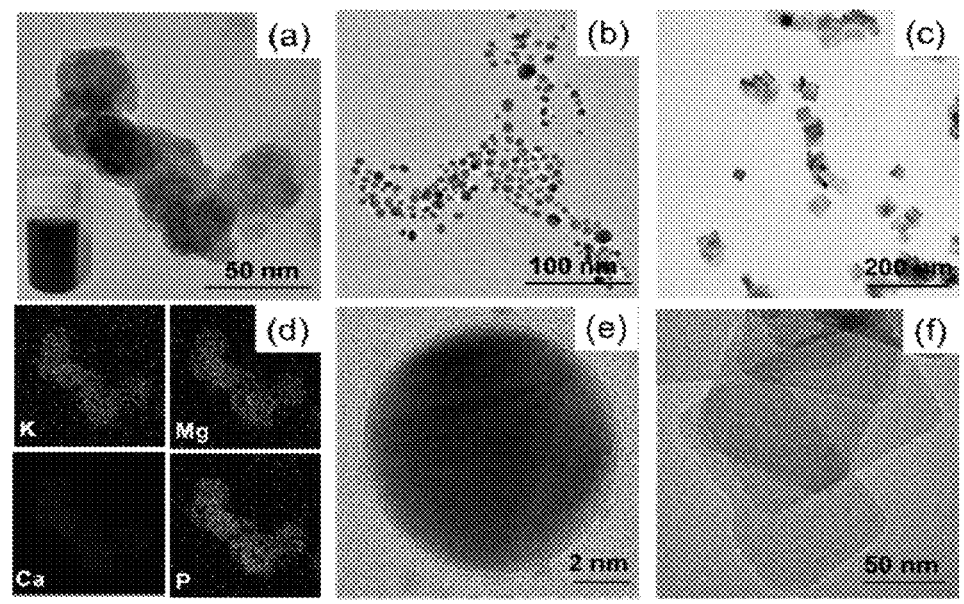
FIG. 1 (*a*) is a photograph measured by TEM showing graminoids extracted from natural grasses.

In order to prepare silver nanoparticles with a size of 13.8 nm, a silver perchlorate ($AgClO_4$) solution was added to an aqueous solution at 4° C., in which sodium borohydride ($NaBH_4$) and sodium citrate were dissolved, subjected to reaction, washed with ethanol several times, and stored in a refrigerator. In order to prepare a sheet type titanium dioxide with a size of nanometers, titanium butoxide ($C_{16}H_{36}O_4Ti$) was mixed with hydrofluoric acid and the mixture was put in an autoclave and subjected to hydrothermal synthesis at 180° C. for one day. Then, the treated product was washed with water and ethanol several times. The prepared sheet type titanium dioxide had a thickness of 7 nm and a size ranging from 50 to 100 nm. FIG. 1 shows Transmission Electron Microscopy (TEM) photographs of graminoids (FIG. 1 (*a*)), silver nanoparticles (FIGS. 1 (*b*) and (*e*)) and the sheet type titanium dioxide (FIGS. 1 (*c*) and (*f*)), respectively, prepared according to the above-described methods. FIG. 1 (*d*) illustrates results of element analysis of the graminoids shown in FIG. 1*a* by energy dispersive X-ray spectroscopy (EDS). Since the central metal ion of chlorophyll, that is, magnesium, and constitutional elements of a nucleic acid complex in a photosystem, that is, potassium, calcium and phosphorus were detected, it was found that graminoids extracted from grass were retained in the same state as in nature.

Figure 2:
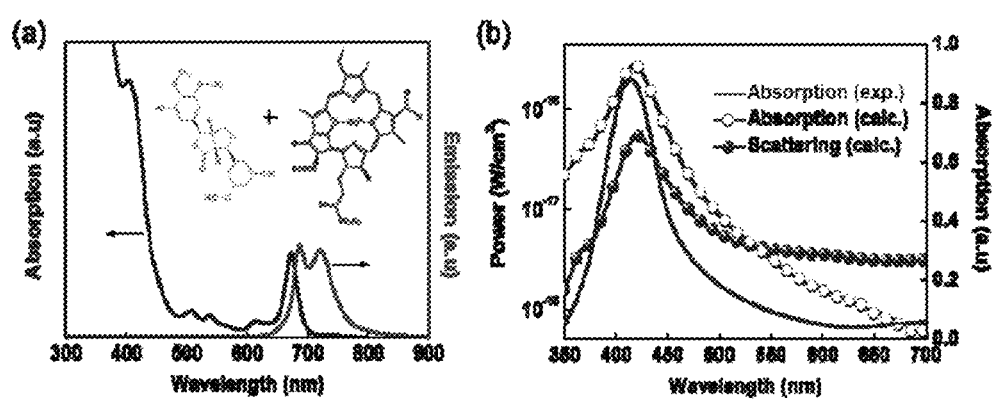
FIG. 2 (*a*) is a diagram showing light absorption and emission effects measured by dissolving graminoids in an ethanol solution, wherein a molecular formula at a left side included in the drawing represents graminone while another molecular formula at a right side represents chlorophyll.

Measured results of light absorption and emission effects of the graminoids and plasmonic silver nanoparticles extracted according to the above methods are shown in FIG. 2. Main absorption peaks of the graminoid extract have been observed at 403 nm and 672 nm (FIG. 2 (*a*)), wherein the absorption peak at 403 nm occurs by absorption of a mixture of graminone and chlorophyll, while the absorption peak at 672 nm is formed by absorption of a chlorophyll chromophore. The light emission effect of the graminoid extract produces main light emission peaks at 685 nm and 721 nm, both of which are associated with photosystem II and photosystem I, respectively, demonstrating that graminoid extracts from grasses retain graminoids substantially in the same state as in nature. Further, for the absorption peak at 672 nm, an extinction coefficient ($\epsilon$) calculated in a density condition of 0.7 mg/mL according to the Beer-Lambert law was $13.4 \times 10^3$ $cm^{-1}M^{-1}$, which is a value substantially comparable to those of N719 or Z907 as metal-organic dye materials commercially available in the related art. Results of light absorption measurement of silver nanoparticles, as well as light absorption and scattering effects calculated by optical computer simulation are shown in FIG. 2 (*b*). From this drawing, it can be seen that the silver nanoparticle with a size of 13.8 nm exhibits light absorption and scattering effects in a wavelength range from 350 nm to 700 nm by a surface plasmon effect. Among them, main absorption and scattering peaks in the wavelength range from 350 to 530 nm include a wavelength range of 403 nm at which one of the main peaks exists, therefore, graminoids absorb light scattered by silver nanoparticles repeatedly, to thus derive effects of improving light generation efficiency of the graminoids. Alternatively, even after the wavelength of 530 nm, a scattering intensity of silver nanoparticles is retained as it is, therefore, the same effect may also be provided in a wavelength range of 672 nm at which another main absorption peak of the graminoids exists.

When the sheet type titanium dioxide prepared as described above is placed on a transparent electrode by a doctor blade process, and then subjected to sintering at 150° C. for 20 minutes, 350° C. for 15 minutes and 500° C. for 30 minutes, gradually, it may be laminated with a thickness of about 4 μm on the transparent electrode. Alternatively, according to a method of dipping the transparent electrode having the sheet type titanium dioxide laminated thereon and a non-processed photo-electrode at an interval of 3 mm into a solution in which the prepared silver nanoparticles with a size of 13.8 nm are dispersed, and then applying a 50V direct current to the same for 15 minutes, silver nanoparticles may be laminated. Next, in order to bond an organic ligand material to the above electrode, the transparent electrode having the prepared silver nanoparticles and the sheet type titanium dioxide laminated thereon is immersed into an ethanol solution containing the organic ligand material dissolved with a density of 15 mg/mL for one day. Thereafter, the transparent electrode is immersed in the solution containing graminoids dissolved therein for 4 days or more to laminate graminoids thereon, and thereby completing a photo-electrode. A counter-electrode is prepared by spin-coating the transparent electrode with a chloroplatinic acid solution and heating the same at 380° C. for 20 minutes. The prepared photo-electrode and counter-electrode are piled up and bonded together while interposing Surlyn films having a thickness of 50 micrometers therebetween, and an electrolyte including 50 mM of an iodine/trivalent iodine redox compound, 70 mM of a mixture of lithium, pyridine, tert-butylpyridine and 0.2 mg/mL of graminoids dissolved in an acetonitrile solution is injected into a space between the above electrodes, thereby completing a photovoltaic cell. All solar cell characteristics may be measured under Air mass (AM) 1.5 standard conditions.

Figure 3:
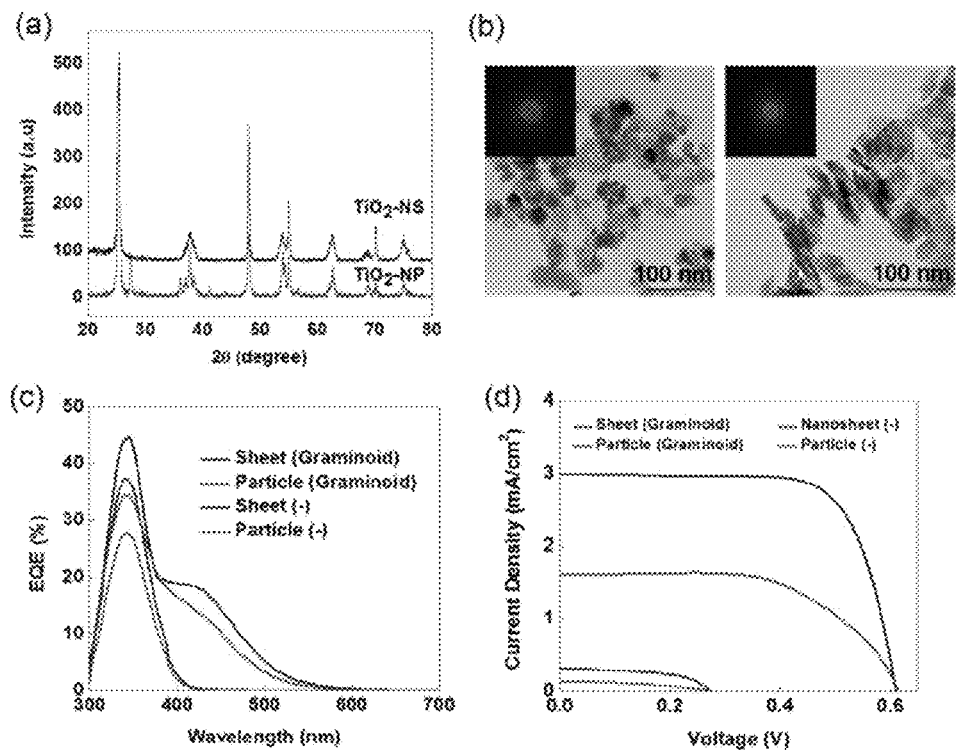
FIG. 3 (*a*) is a diagram showing powder X-ray diffraction (PXRD) measurement results of titanium dioxide in random form ($TiO_2$-NP) as well as a sheet type titanium dioxide ($TiO_2$-NS)

FIG. 3 illustrates solar cell characteristics of a photovoltaic cell based on types of titanium dioxide as an electrode acceptor. Random type powder particles commonly used in the related art were employed as a control group (FIG. 3 (*b*)), and a lamination process of the organic ligand material as well as silver nanoparticles has been omitted from a method for fabricating a bio-photovoltaic cell described above. Regardless of whether graminoids are present or not, when the sheet type titanium dioxide was used, a more improved light energy conversion characteristic was exhibited. From external quantum efficiency (EQE) results in FIG. 3*c*, it can be found that graminoids respond to light in a wide range of infrared to visible light regions.

Figure 4:
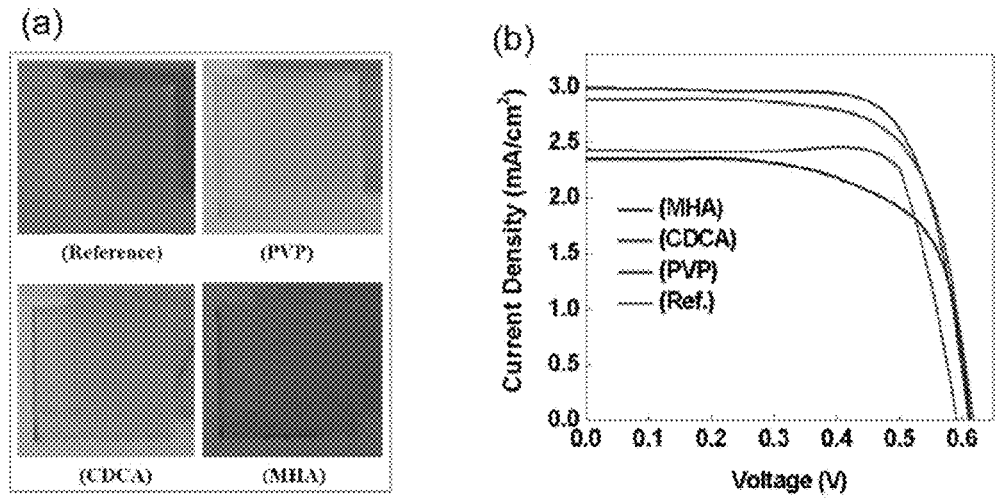
FIG. 4 (*a*) is photographs of photo-electrodes prepared using PVP, CDCA, MHA organic ligand materials.

FIG. 4 illustrates light energy conversion characteristics according to types of organic ligand materials. Real forms of photo-electrodes prepared using polyvinylpyrrolidone (PVP), chenodeoxycholic acid (CDCA), maleimidohexanoic acid (MHA), respectively, are shown in FIG. 4 (a), and current-voltage curves of photovoltaic cells fabricated using the respective photo-electrodes are shown in FIG. 4 (b). Considering that CDCA and MHA having carboxyl groups (—COOH) in their molecular structures exhibited more effective solar cell characteristics compared to PVP with no carboxyl group, it is determined that the carboxyl group may enable smooth interfacial bonding between graminoids and silver nanoparticles. Among three different organic ligand materials, MHA exhibited the most excellent solar cell characteristics. Individual measurement values are listed in Table 1.

Figure 5:
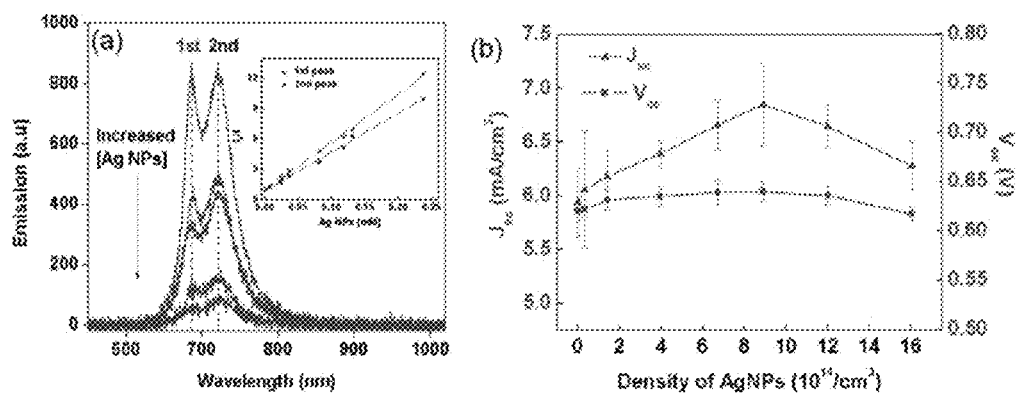
FIG. 5 (*a*) is a diagram showing results of spectrometric measurement results of fluorescence decay of graminoids according to an increase in silver nanoparticles laminated on the photo-electrode.

In order to investigate how much the silver nanoparticles receive electrons generated from graminoids, fluorescence decay spectroscopy measurements were conducted and the results thereof are shown in FIG. 5 (a). As a result of a shortwave laser light irradiation at 532 nm on the graminoids, emission peaks were observed at the wavelengths of 685 nm and 721 nm and these indicate photosystem II and photosystem I, respectively. With increased density of silver nanoparticles laminated on the photo-electrode, the intensities of two emission peaks irradiated by the graminoids were gradually reduced. This means that the silver nanoparticles effectively extract photo-electrons emitted by the graminoids. Such characteristics of silver nanoparticles was calculated by Stern-Volmer Equation of $I_o/I=1+K_{sv}[AgNPs]$, and decay rates $K_{sv}$ at 685 nm and 721 nm were $4.8 \times 10^4$ $M^{-1}$ and $3.4 \times 10^4$ $M^{-1}$, respectively, which is substantially at least 2-fold higher than the decay rate by a gold-chlorophyll complex. FIG. 5 (b) represents varied current and voltage values of the photovoltaic cell depending on the density of silver nanoparticles dispersed in the solution used for laminating the silver nanoparticles on the photo-electrode by electrophoresis. From this drawing, it can be found that, when the solution containing the silver particles dispersed with a density of 0.8 mg/mL therein was used, the highest solar cell characteristics are obtained.

Figure 6:
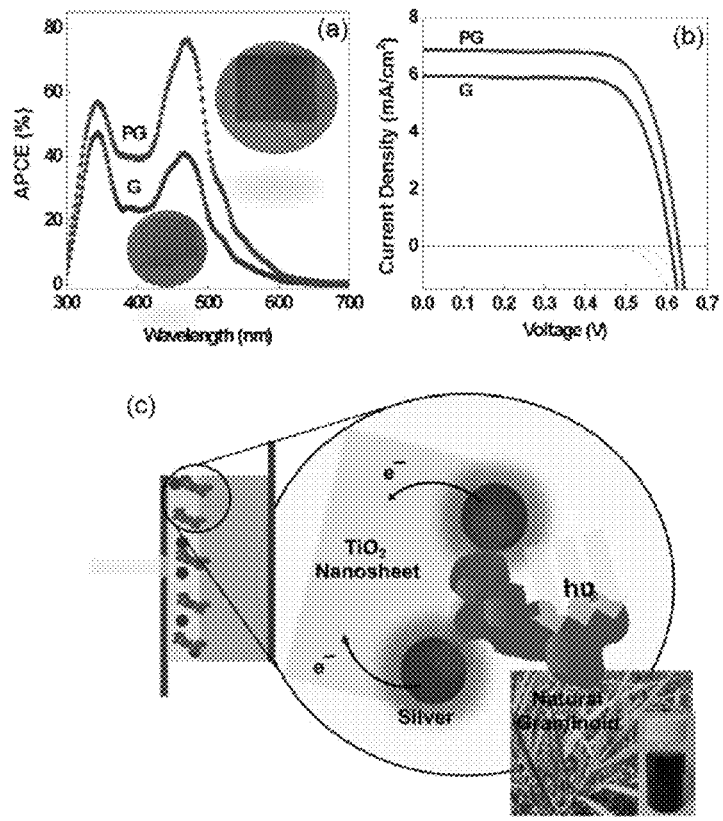
FIG. 6 (*a*) is a diagram showing APCE results of a photovoltaic cell finally fabricated with maximum efficiency (PG: photovoltaic cell using graminoids with silver nanoparticles inserted therein, G: photovoltaic cell using graminoids only), wherein insets of the drawing represent real photographs of a photo-electrode, respectively.

FIG. 6 (a) illustrates results of absorbed photon-to-current efficiency (APCE) measurement that shows characteristics of converting light absorbed by the photovoltaic cell into current by wavelength range. High photocurrent conversion efficiencies were represented at 342 nm and 472 nm, and it is presumed that these results are obtained by titanium dioxide and graminoids, respectively. In particular, if silver nanoparticles as well as graminoids are present (PG), higher photocurrent conversion efficiency is exhibited in a wavelength region of 472 nm than a case of only graminoids being present (G). Current-voltage curves measured under different conditions are shown in FIG. 6 (b) and solar cell characteristic values calculated from the same are listed in Table 1. The following Table 1 represents a summary of solar cell characteristic values of the photovoltaic cells fabricated according to the present invention.

TABLE 1

| Type of electrode | $V_{DC}$ [V] | $J_{DC}$ [mA/cm$^2$] | FF [%] | PCE [%] |
|---|---|---|---|---|
| MHA | 0.62 | 2.98 | 0.71 | 1.34 |
| CDCA | 0.62 | 2.88 | 0.69 | 1.25 |
| PVP | 0.62 | 2.34 | 0.66 | 0.95 |
| Ref. | 0.60 | 2.43 | 0.77 | 1.13 |
| PG | 0.64 | 6.85 | 0.72 | 3.16 |
| G | 0.62 | 5.94 | 0.71 | 2.36 |

The photocurrent conversion efficiency of a finally completed PG photovoltaic cell was 3.16%, which is increased by 185% compared to the maximum photocurrent conversion efficiency, 1.51%, of the bio-photovoltaic cells that have been reported up to now [L. Yang et al., Energy Environ, Sic., 2014, 7, 343]. Reasons for this result may include: an amount of photo-electrons generated from graminoids is increased by plasmonic silver nanoparticles, as illustrated in FIG. 6 (c); the photo-electrons generated from the graminoids are not extinct by re-coupling of electrons-holes but are instead transferred to silver nanoparticles due to a smooth interfacial contact formed by MHA organic ligand material; and, because of excellent fluorescence decay rates and electron transfer properties of the silver nanoparticles, a great amount of photo-electrons can be transferred to a titanium dioxide electron acceptor.

As described above, the PG photovoltaic cell finally completed according to the present invention exhibits improved characteristics such as a photocurrent conversion efficiency of 3.16%, which is increased by 185% compared to 1.5% as the maximum value of the bio-photovoltaic cells that have been reported up to now, therefore, may achieve high industrial applicability.

While the present invention has been described with reference to the preferred embodiments, the present invention is not limited to the above-described embodiments, and it will be understood by those skilled in the related art that various modifications and variations may be made therein without departing from the scope of the present invention as defined by the appended claims.

CONCLUSION

All of the various embodiments or options described herein can be combined in any and all variations. While the invention has been particularly shown and described with reference to some embodiments thereof, it will be understood by those skilled in the art that they have been presented by way of example only, and not limitation, and various changes in form and details can be made therein without departing from the spirit and scope of the invention. Thus, the breadth and scope of the present invention should not be limited by any of the above described exemplary embodiments, but should be defined only in accordance with the following claims and their equivalents.

All documents cited herein, including journal articles or abstracts, published or corresponding U.S. or foreign patent applications, issued or foreign patents, or any other documents, are each entirely incorporated by reference herein, including all data, tables, figures, and text presented in the cited documents.

What is claimed is:

1. A method for fabricating a high efficiency bio-photovoltaic cell using plasmonic metal nanoparticles and naturally extracted graminoids, comprising:
   a first process of extracting one of graminoids or chlorophylls from natural grasses;
   then, a second process of preparing metal nanoparticles selected from silver, gold, platinum or palladium, and a sheet type titanium dioxide electron acceptor, wherein the metal nanoparticles provide a surface plasmon effect;
   then, a third process of laminating the sheet type titanium dioxide electron acceptor, the silver nanoparticles and a naturally extracted photo sensitizer on a transparent electrode to prepare a photo-electrode; and
   then, a fourth process of preparing a platinum coated counter-electrode having platinum and injecting an electrolyte between the photo-electrode and the counter-electrode to complete a photovoltaic cell,
wherein the inserted metal nanoparticles are coupled to a bio-photo sensitizer through an organic ligand material while exhibiting surface plasmon effect.

2. The method according to claim 1, wherein the one of graminoids or chlorophylls comprises a bio-material used in photosystems I and II.

3. The method according to claim 1, wherein the electron acceptor used in the second process comprises a semiconductor material in a nano-sheet form.

4. The method according to claim 1, wherein the third process comprises:
   laminating the semiconductor electron acceptor, the plasmonic metal particles and the naturally extracted photo sensitizer in sequential order; and
   coupling the plasmonic metal particles on the naturally extracted photo sensitizer through an organic ligand material containing a carboxyl group.

5. The method according to claim 1, wherein the electrolyte used in the fourth process is prepared by dissolving an iodine/trivalent iodine redox compound, lithium, pyridine, tert-butylpyridine and the naturally extracted photo sensitizer in an acetonitrile solution.

\* \* \* \* \*